United States Patent [19]

Bartel et al.

[11] Patent Number: 4,748,294

[45] Date of Patent: May 31, 1988

[54] HOUSING FOR AN ELECTROMECHANICAL DEVICE

[75] Inventors: Wieland A. Bartel, Eckental-Ebach; Hans P. Meyer, Nuremberg; Bernhard F. Nitschke, Herzogenaurach, all of Fed. Rep. of Germany

[73] Assignee: Alcatel N.V., Amsterdam, Netherlands

[21] Appl. No.: 941,516

[22] Filed: Dec. 12, 1986

Related U.S. Application Data

[63] Continuation of Ser. No. 648,103, Sep. 7, 1984, abandoned.

[30] Foreign Application Priority Data

Sep. 17, 1983 [DE] Fed. Rep. of Germany ....... 3333684

[51] Int. Cl.[4] ............ H05K 5/06

[52] U.S. Cl. ............ 174/52 S; 264/261; 264/272.11

[58] Field of Search ............ 174/52 S, 52 PE; 264/261, 272.11

[56] References Cited

U.S. PATENT DOCUMENTS 4,349,693 9/1982 Hinrichs ............ 174/52 PE
4,366,345 12/1982 Jälgle ............ 174/52 S

FOREIGN PATENT DOCUMENTS 2851329 6/1979 Fed. Rep. of Germany .
8020770 10/1980 Fed. Rep. of Germany .

*Primary Examiner*—R. L. Moses
*Assistant Examiner*—David A. Tone
*Attorney, Agent, or Firm*—Christie, Parker & Hale

[57] ABSTRACT

A relay housing comprising a cover plate which is inserted in a step-shaped recess of a housing rim. The rim portion of the plate has a reduced thickness so that there is formed a rim channel between the plate and the housing rim. The channel is in communication with fill-in cavities in the cover plate through which the channel is filled with a self-hardening or curable material. The fill-in cavities are formed as flat recesses adjoining the rim channel with wide openings, not connected among each other, that are at least twice as large as the width of the rim channel. The bottom of the channel slopes downwardly from said openings. This arrangement permits a quick sealing by use of only small amounts of sealing compound.

4 Claims, 1 Drawing Sheet

HOUSING FOR AN ELECTROMECHANICAL DEVICE

This is a continuation of application Ser. No. 648,103 filed Sept. 7, 1984, now abandoned.

BACKGROUND OF THE INVENTION

The present invention relates generally to an electromechanical device and, in particular, to a sealed housing for such a device, such as a relay.

One such relay with a housing and a sealed base plate is known from European Pat. No. 0 007 068, which proposes fill-in channels and a rim channel to be provided in the bottom side of the lower part, which are in a spaced relation and extend parallel to one another. The fill-in channels open up into the rim channel without changing their cross-section, and the rim channel extends along a capillary rim gap. To enabling better levelling of the sealing compound, the bottom surfaces of the fill-in channels are sloped toward the capillary channel. The application of the sealing compound is effected with the aid of nozzle-type sealing compound dispensers which are disposed next to each other.

Moreover, it is known from German Pat. No. 2 851 329 to provide on the bottom of a housing a network of grooves having a capillary effect, which are all connected to a central, circular closing cavity. Following the filling-in of a predetermined amount of sealing compound into the dosing cavity, the compound, due to the capillary effect of the network, flows to the terminal lead-through openings in the housing bottom to be sealed.

It is the object of the present invention to distribute the sealing compound as quickly as possible along the rim of a housing to reduce manufacturing costs.

SUMMARY OF THE INVENTION

According to a principal aspect of the present invention, there is provided a housing for an electromechanical device which is tightly sealed by a sealing compound. A cover or base plate is inserted in a step-shaped recess of a housing rim. The rim portion of the plate has a reduced thickness forming between the plate and the housing rim a rim channel which is in communication with fill-in cavities in the plate through which the rim channel is filled with a self-hardening or curable material. The fill-in cavities are formed as flat recesses adjoining the rim channel. The recesses are connected to each other only by the rim channel. The recesses have openings merging with the bottom of the rim channel. The openings are at least twice as large as the width of the rim channel. The bottom of the rim channel slopes downwardly from said openings toward the housing rim.

Due to the large openings extending from the recesses to the rim channel, the sealing compound is permitted to flow quickly into the rim channel. This flow-off is further assisted by the downwardly sloped rim bottom. Moreover, by the sloping rim bottom there is produced a very small-volume separating point between the cover plate and the rim of the housing, so that even when only a little sealing compound is applied to the recesses in the cover plate, there is assured an effective sealing of the plate to the housing rim.

DESCRIPTION OF THE PREFERRED EMBODIMENTS

Figure 1:
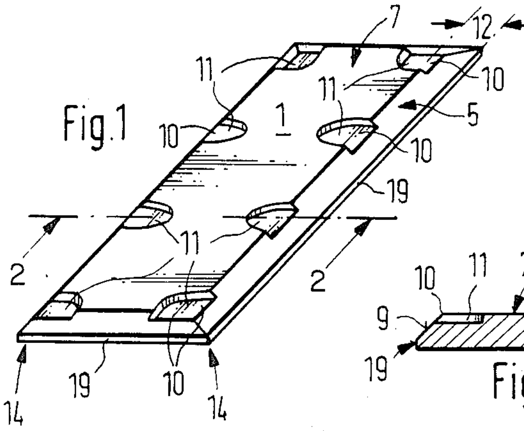
FIG. 1 is a perspective view of the cover plate of a relay housing embodying the present invention.
Figure 2:
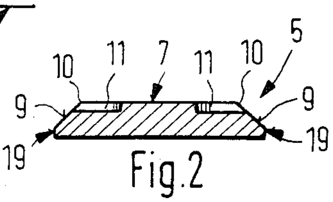
FIG. 2 is a transverse sectional view taken along line 2—2 of FIG. 1.
Figure 3:
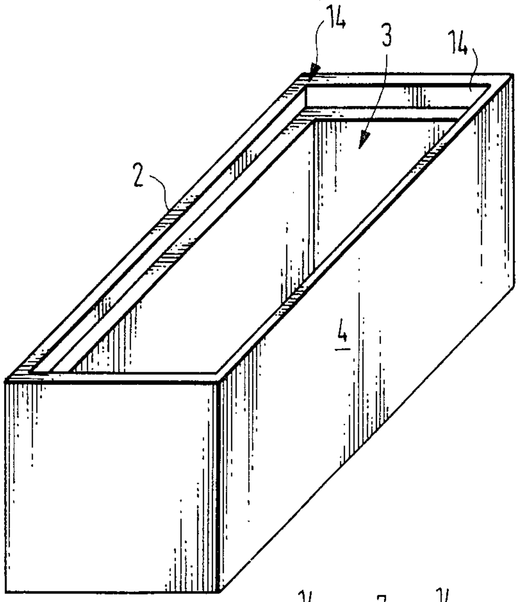
FIG. 3 is a perspective view of the associated cup-shaped housing opening.
Figure 4:
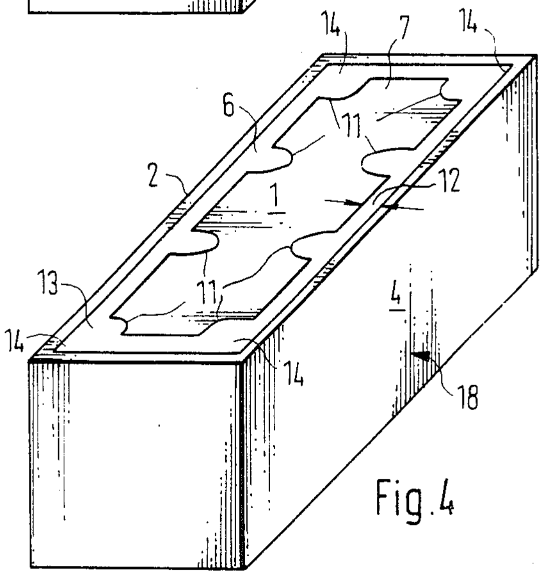
FIG. 4 is a perspective view of the tightly sealed assembled housing.

In the drawings, the reference numeral 1 indicates a cover plate or a bottom plate intended to be placed into an opening 3 of a cup-shaped housing member 4 to form the housing shown in FIG. 4. The housing member 4 is stepped at the rim portion 2.

The rim portion or border 5 of the cover plate is of reduced thickness so that, when the plate is inserted within the housing member 4, there is formed a rim channel 6 together with the rim portion 2 of the housing member. The top side 7 of the cover plate slopes downwardly toward the outside within the area of the rim portion 5, so that the rim channel 6 has a bottom 9 which slopes toward the separating point 8 between the rim portion 5 of the cover plate and the rim portion 2 of the housing member 4. Fill-in and dosing cavities in the form of recesses 11 are provided in the top side 7 of the cover plate. The openings 10 of the recesses merge with the bottom 9 of the rim channel adjacent to its upper edge.

The openings 10 are considerably larger, that is, longer than the rim width 12. In particular, they are at least twice as large as the width 12. The recesses 11, in the top view, almost have the shape of semicircles, and the opening 10 of each recess almost forms the diameter thereof, so that the upper region of the rim bottom 9 changes approximately in the diameter area, over into the semicircle. Instead of having the shape of a semicircle, the recesses 11 may also be designed to have a triangular or square shape, with one side thereof forming the opening 10 and bordering on the rim bottom 9. This arrangement results in a large flow-off cross section for the sealing compound 13 to be cast in the rim channel 6. Due to the sloping rim bottom 9, the sealing compound 13, as dripped or sprayed into the recesses 11, quickly flows off toward the separating point 8. It can be seen that when the top side, or face of the base plate is horizontal, the rim bottom 9 extends at a plurality of degrees away from both the horizontal and the vertical. There is accomplished a good sealing, even if very small doses of sealing compound 13 are used, because the compound flows toward the lowest point. Thus, sealing of the housing is effected even in those cases when the rim channel 6 is not filled completely with sealing compound.

In order to use as little sealing compound as possible and to achieve a quick levelling thereof, the bottoms of the recesses 11 are located at a relatively high point on the rim bottom 9. For this reason also the recesses 11 are of a very flat design, with the depth thereof amounting to no more than one-half or one-third of the thickness of the cover plate 1. Moreover, the recesses 11 are preferable distributed symmetrically along the rim channel 6, without being in connection with one another. In particular, recesses 11 are provided at the corners 14 of the cover plate 1 or of the housing member 4, so that especially in these critical areas, the separating point 8 can be sealed by the sealing compound 13.

Preferably, the rim bottom 9 is bevelled in such a way that there still remains a vertical rim surface edge 19 amounting preferably to a maximum of one-third of the cover thickness. The separating point 8, in this case, may form a fine gap.

Preferably a filling device having eight filling funnels arranged at the same distance as the eight recesses 11 is used for filling all the recesses 11 simultaneously with the sealing compound.

Figure 5:
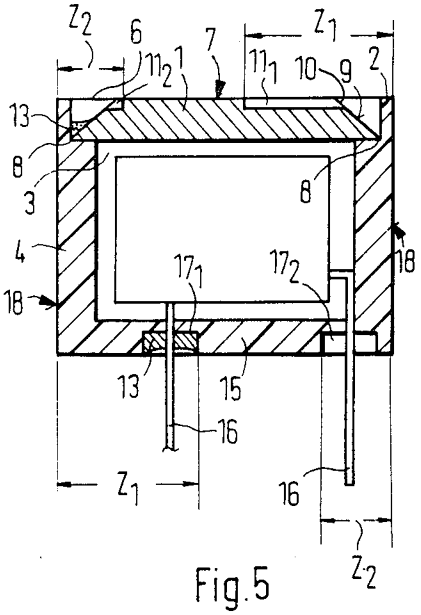
FIG. 5 is a transverse sectional view taken through an alternative sealed housing with terminal elements being provided for in the bottom of the housing member.

In the embodiment of the invention illustrated in FIG. 5, electrical terminals 16 of an internal device are led through terminal lead-through holes 17 in the bottom of the cup-shaped housing member. The terminals 16 and openings 17 are arranged in a different transverse spacing or pattern than the recesses 11 in the cover plate 1. In order to utilize the same filling device whose funnels are arranged in the same pattern as the openings $17_1$, $17_2$, etc. for supplying the sealing compound to the top and bottom sides of the housing, then the recesses $11_1$, $11_2$, etc. shown in FIG. 5 must be designed to correspond to the location of the openings $17_1$, $17_2$, etc., respectively. Accordingly, the distances $Z_1$ from the outer walls 18 of the housing to the inner ends of the recess $11_1$ and opening $17_1$ are identical, and the distances $Z_2$ from the outer walls 18 of the housing to the inner ends of the recesses $11_2$ and opening $17_2$ are identical. In this way, the same filling device can be used to fill the recesses $11_1$, $11_2$, etc. by rotating the housing through an angle of 180 degrees about its longitudinal axis. That is, in FIG. 5 recess $11_2$ is at the upper left, and upon rotation, opening $17_2$ is at the upper left. Thus, a filling funnel can fill both the recess $11_2$ and the opening $17_2$ without having to change its position. The same holds true for another funnel which is used to fill both the recess $11_1$ and the opening $17_1$. The recesses $11_1$, $11_2$, and the holes $17_1$, $17_2$ are filled with the sealing compound 13, such compound being shown only in the hole $17_1$ of the housing in FIG. 5.

What is claimed is:

1. In a housing for an electromechanical device which is tightly sealed by a sealing compound, said housing comprising a rectangular plate which has a top face, and which is inserted in a step-shaped recess of the rim of a housing member, the rim portion of the plate having a reduced thickness forming between the plate and the housing rim; a rim channel which is in communication with fill-in cavities in the plate through which the rim channel is filled with a self-hardening or curable material; and an edge gap between the step shaped recess and the rim portion of the plate, the improvement comprising:

said fill-in cavities being formed as flat recesses each generally the shape of a sector of a circle having a radius adjoining said rim channel;

said fill-in cavities being connected to each other only by said rim channel;

said fill-in cavities having relatively wide openings merging with the bottom of said rim channel;

at least a first four of said fill-in cavities being of semicircular configuration and being symmetrically distributed along two opposing sides of said plate;

a second four of said fill-in cavities being of quarter-circular configuration and being located at the four corners of said plate; and said rim portion of said plate being bevelled, so when the outer face of said plate lies in a horizontal plane facing upwards, the bottom of said rim channel extends downwardly from said openings of said fill-in cavities to said edge gap.

2. A housing as set forth in claim 1 wherein:

said recesses, in a top view, have a width and length that are about equal.

3. A housing as set forth in claim 1 wherein:

said bottom of said rim channel slopes downwardly to a vertical rim edge having a height no greater than one third of the thickness of said step-shaped recess of the housing rim.

4. A housing for an internal electromechanical device which has terminals, and which is tightly sealed by a sealing compound, comprising a cover or base plate inserted in a step-shaped recess of the rim of a housing member, the rim portion of the plate having a reduced thickness and forming, between the plate and the housing rim, a rim channel which is in communication with fill-in cavities in the plate through which the rim channel is filled with a self-hardening or curable material, the improvement comprising:

said fill-in cavities being formed as flat recesses adjoining said rim channel;

said recesses being connected to each other only by said rim channel;

said recesses having openings merging with the bottom of said rim channel, said openings being at least twice as large as the width of said rim channel; and the bottom of said rim channel sloping downwardly from said openings toward said housing rim;

said housing member having a bottom with lead-through openings arranged in a pattern and said terminals of said internal device extend through said lead-through openings and are sealed therein; and portions of said recesses in said cover plate are arranged in the same pattern as that of said terminal lead-through openings in said bottom.

* * * * *